(12) United States Patent
Price et al.

(10) Patent No.: US 9,455,552 B1
(45) Date of Patent: *Sep. 27, 2016

(54) LASER DIODE APPARATUS UTILIZING OUT OF PLANE COMBINATION

(71) Applicant: nLIGHT Photonics Corporation, Vancouver, WA (US)

(72) Inventors: R. Kirk Price, Battle Ground, WA (US); Scott A. Lerner, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/726,586

(22) Filed: Dec. 25, 2012

(51) Int. Cl.
*H01S 5/00* (2006.01)
*H01S 5/40* (2006.01)
*H01S 5/42* (2006.01)

(52) U.S. Cl.
CPC .............. *H01S 5/40* (2013.01); *H01S 5/4075* (2013.01); *H01S 5/42* (2013.01); *H01S 5/4025* (2013.01)

(58) Field of Classification Search
CPC ...... H01S 5/423; H01S 5/42; H01S 5/02423; H01S 3/034
USPC ........ 372/23, 50.23, 50.12, 36, 99, 107, 108
See application file for complete search history.

(56) References Cited

U.S. PATENT DOCUMENTS

| | | |
|---|---|---|
| 3,622,906 A | 11/1971 | Nyul |
| 3,827,059 A | 7/1974 | Rambauske |
| 4,550,333 A | 10/1985 | Ridder et al. |
| 4,689,482 A * | 8/1987 | Horikawa et al. ............ 250/205 |
| 4,716,568 A | 12/1987 | Scifres et al. |
| 4,719,631 A | 1/1988 | Conaway |
| 4,828,357 A | 5/1989 | Arata et al. |
| 5,048,911 A | 9/1991 | Sang et al. |
| 5,077,750 A | 12/1991 | Pocholle et al. |
| 5,105,430 A | 4/1992 | Mundinger et al. |
| 5,168,401 A | 12/1992 | Endriz |
| 5,305,344 A | 4/1994 | Patel |
| 5,319,528 A | 6/1994 | Raven |
| 5,515,391 A | 5/1996 | Endriz |
| 5,610,930 A | 3/1997 | Macomber et al. |
| 5,668,822 A | 9/1997 | Tada |

(Continued)

FOREIGN PATENT DOCUMENTS

| | | |
|---|---|---|
| CN | 1829015 | 9/2006 |
| CN | 1975507 | 6/2007 |

(Continued)

OTHER PUBLICATIONS

Edwin, "Stripe Stacker for Use with Laser Diode Bars," Optics Letters, 20:222-224 (Jan. 15, 1995).

(Continued)

*Primary Examiner* — Tuan Nguyen
(74) *Attorney, Agent, or Firm* — Klarquist Sparkman, LLP

(57) ABSTRACT

A diode laser apparatus includes a plurality of spaced apart diode lasers, each of the diode lasers situated and configured to emit a diode laser beam substantially parallel to each other diode laser beam in an emission plane in a first direction, and a plurality of reflectors situated with respect to the diode lasers and configured to receive respective diode laser beams and to reflect the respective diode laser beams substantially parallel and out of the emission plane at a small angle therewith in a second direction such that the reflected diode laser beams are in a stacked configuration.

14 Claims, 5 Drawing Sheets

(56) References Cited

U.S. PATENT DOCUMENTS

| | | | |
|---|---|---|---|
| 5,764,675 A | 6/1998 | Juhala | |
| 5,825,551 A | 10/1998 | Clarkson et al. | |
| 5,828,683 A * | 10/1998 | Freitas | 372/36 |
| 5,887,096 A | 3/1999 | Du et al. | |
| 5,898,211 A | 4/1999 | Marshall et al. | |
| 5,909,458 A | 6/1999 | Freitas et al. | |
| 5,986,794 A | 11/1999 | Krause et al. | |
| 5,987,043 A | 11/1999 | Brown et al. | |
| 6,028,722 A | 2/2000 | Lang | |
| 6,044,096 A | 3/2000 | Wolak et al. | |
| 6,057,871 A | 5/2000 | Peterson | |
| 6,075,912 A | 6/2000 | Goodman | |
| 6,115,185 A | 9/2000 | Du et al. | |
| 6,124,973 A * | 9/2000 | Du et al. | 359/618 |
| 6,229,831 B1 * | 5/2001 | Nightingale et al. | 372/36 |
| 6,240,116 B1 * | 5/2001 | Lang et al. | 372/50.12 |
| 6,266,359 B1 | 7/2001 | Taheri et al. | |
| 6,324,320 B1 | 11/2001 | Goodman | |
| 6,327,285 B1 | 12/2001 | Wang | |
| 6,377,410 B1 * | 4/2002 | Wang et al. | 359/837 |
| 6,462,883 B1 | 10/2002 | Wang et al. | |
| 6,552,853 B2 | 4/2003 | Goodman | |
| 6,556,352 B2 | 4/2003 | Wang et al. | |
| 6,636,538 B1 | 10/2003 | Stephens | |
| 6,673,699 B2 | 1/2004 | Hubbard et al. | |
| 6,680,800 B1 | 1/2004 | Schreiber et al. | |
| 6,683,727 B1 | 1/2004 | Goring et al. | |
| 6,700,709 B1 | 3/2004 | Fermann | |
| 6,710,926 B2 * | 3/2004 | Beach et al. | 359/623 |
| 6,765,725 B1 | 7/2004 | Fermann et al. | |
| 6,778,732 B1 | 8/2004 | Fermann | |
| 6,898,222 B2 | 5/2005 | Hennig et al. | |
| 6,975,659 B2 | 12/2005 | Nagano et al. | |
| 7,420,996 B2 | 9/2008 | Schulte et al. | |
| 7,436,868 B2 | 10/2008 | Schulte et al. | |
| 7,443,895 B2 | 10/2008 | Schulte et al. | |
| 7,586,963 B2 | 9/2009 | Schulte et al. | |
| 7,733,932 B2 * | 6/2010 | Faybishenko | G02B 6/4206 372/36 |
| 7,751,458 B2 | 7/2010 | Regaard et al. | |
| 7,764,723 B2 | 7/2010 | Ovtchinnikov et al. | |
| 7,830,608 B2 | 11/2010 | Hu | |
| 7,848,372 B2 | 12/2010 | Schulte et al. | |
| 7,947,517 B2 | 5/2011 | Hisa | |
| 8,000,360 B2 | 8/2011 | Faybishenko | |
| 8,066,389 B2 | 11/2011 | Silverstein et al. | |
| 8,126,028 B2 | 2/2012 | Clifford, Jr. | |
| 8,339,598 B2 | 12/2012 | Ban et al. | |
| 8,427,749 B2 | 4/2013 | Du et al. | |
| 8,432,945 B2 | 4/2013 | Faybishenko | |
| 8,437,086 B2 | 5/2013 | Du et al. | |
| 8,488,245 B1 * | 7/2013 | Chann | H01S 5/4031 353/34 |
| 8,508,729 B2 | 8/2013 | Ban et al. | |
| 8,553,221 B2 | 10/2013 | Volodin et al. | |
| 8,599,485 B1 | 12/2013 | Cobb | |
| 8,654,326 B2 | 2/2014 | Volodin et al. | |
| 8,830,587 B2 * | 9/2014 | Bhatia | H01S 5/4012 359/589 |
| 8,842,369 B2 | 9/2014 | Li | |
| 8,861,082 B2 | 10/2014 | Cobb | |
| 8,873,134 B2 | 10/2014 | Price et al. | |
| 8,891,579 B1 * | 11/2014 | Price | H01S 5/02292 372/107 |
| 8,942,521 B2 | 1/2015 | Song et al. | |
| 9,005,262 B2 | 4/2015 | Liu et al. | |
| 2004/0114027 A1 | 6/2004 | Frith | |
| 2006/0165144 A1 | 7/2006 | Mikhailov et al. | |
| 2006/0280209 A1 * | 12/2006 | Treusch | G02B 27/0905 372/32 |
| 2007/0116071 A1 | 5/2007 | Schulte et al. | |
| 2007/0116077 A1 | 5/2007 | Farmer et al. | |
| 2007/0217467 A1 | 9/2007 | DeFranza et al. | |
| 2007/0217468 A1 | 9/2007 | DeFranza et al. | |
| 2007/0217469 A1 | 9/2007 | DeFranza et al. | |
| 2007/0217470 A1 | 9/2007 | DeFranza et al. | |
| 2007/0217471 A1 | 9/2007 | DeFranza et al. | |
| 2007/0268945 A1 | 11/2007 | Schulte et al. | |
| 2007/0268946 A1 | 11/2007 | Schulte et al. | |
| 2007/0268947 A1 | 11/2007 | Schulte et al. | |
| 2009/0245315 A1 * | 10/2009 | Faybishenko | 372/50.12 |
| 2009/0323752 A1 * | 12/2009 | Chuyanov et al. | 372/50.12 |
| 2010/0158060 A1 | 6/2010 | Faybishenko | |
| 2010/0226405 A1 | 9/2010 | Chuyanov et al. | |
| 2013/0148684 A1 | 6/2013 | Guo et al. | |
| 2013/0162956 A1 | 6/2013 | Okuda | |
| 2013/0194801 A1 | 8/2013 | Wolf et al. | |
| 2014/0036375 A1 | 2/2014 | Chann et al. | |

FOREIGN PATENT DOCUMENTS

| | | |
|---|---|---|
| CN | 101141051 | 3/2008 |
| CN | 101144909 | 3/2008 |
| CN | 201113224 | 9/2008 |
| CN | 201515142 | 6/2010 |
| CN | 102074896 | 5/2011 |
| CN | 102437509 | 5/2012 |
| CN | 202548385 | 11/2012 |
| CN | 202720390 | 2/2013 |
| CN | 203071399 | 7/2013 |
| CN | 103368066 | 10/2013 |
| CN | 103401136 | 11/2013 |
| RU | 2010143026 | 4/2012 |
| WO | WO 2005059626 | 6/2005 |

OTHER PUBLICATIONS

International Search Report and Written Opinion for International Application No. PCT/US2015/019288, mailed Jun. 10, 2015.
Notice of Allowance for corresponding U.S. Application No. 13/328,877, mailed Sep. 5, 2014.
Office Action for corresponding U.S. Application No. 13/328,877, mailed Apr. 14, 2014.

* cited by examiner

LASER DIODE APPARATUS UTILIZING OUT OF PLANE COMBINATION

CROSS REFERENCE TO RELATED APPLICATION

This application is related to co-pending and commonly owned U.S. application "Laser Diode Apparatus Utilizing Reflecting Slow Axis Collimators", U.S. Ser. No. 13/328,877 and filed Dec. 16, 2011, the entire content of which is incorporated herein by reference.

BACKGROUND OF THE INVENTION

1. Field of the Invention

Generally, the field of the present invention is laser diode apparatuses.

2. Background

The advent of the semiconductor diode laser has enabled significant advancement in a plethora of technological areas, including the industrial, consumer, and medical arenas.

Even before semiconductor diode lasers matured economically, the idea of producing an ultra-high power, ultra-high density laser beam was disclosed in U.S. Pat. No. 4,828,357 to Arata et al. Separate laser beams are reflected by respective mirrors to form a densely packed bundle of parallel beams or are directed to converge in a particular location. However, directing semiconductor diode lasers into a concentrated beam is significantly more complicated due to anamorphic beam characteristics of the constituent diode lasers, and the size scale and tolerances of the component parts required to fabricate the diode module. Moreover, since many diode modules are fiber-coupled, fiber characteristics such as acceptance angle and aperture size become additional constraints in the design of the module and component parts that provide light to the fiber.

The beam quality of laser diodes is almost diffraction limited with an $M^2$ value close to 1 in the plane perpendicular to the active region, while the beam quality of a broad area device in the plane parallel to the active region is relatively poor with an $M^2$ value typically around 20-30. Furthermore, dead-space between emitters in a laser diode bar array can reduce the $M^2$ to values of around 1000. This asymmetry in beam quality between the fast and slow axes is a primary challenge that needs to be overcome for the use of laser diodes in fiber coupled systems. This is typically achieved by rearranging the array of emitters in the slow axis and stacking them in the fast axis, resulting in a system with matched beam quality in the fast and slow axes.

For example, in U.S. Pat. No. 5,319,528 to Raven, a high power light source is disclosed that includes an array of laser diode modules optically coupled to a beam shaping and combining unit that has anamorphic prism pairs and that optically manipulates and directs beams to flat reflectors. The reflected beams are arranged in a stack that is directed to a focusing lens and subsequently coupled into an optical fiber. U.S. Pat. Nos. 7,733,932 and 8,000,360 to Faybishenko disclose an apparatus that includes a thermally dissipative body with stepped surfaces where upon each surface is mounted a laser diode structure emitting a laser beam parallel to the stepped surface, a slow axis collimation lens, and a beam reflecting turning mirror. Again the reflected beams are arranged in a stack that is directed to a focusing lens and subsequently coupled into an optical fiber.

In bar-based systems, the asymmetric beam quality in the fast and slow axes requires the use of expensive micro-optical beam shaping systems. These systems, which rotate the fast and slow axes of the individual emitters in the laser bar, are typically implemented with the use of step mirror arrays, arrays of micro-optical cylinder lens telescopes rotated by 45 degrees, or by lateral beam displacement techniques, such as those described in U.S. Pat. Nos. 5,986,794 and 6,462,883. While these systems are effective at rotating the optical axes, the optical to optical efficiency is diminished by multiple optical interfaces, imperfect beam rotation or stacking in the fast axis, and low brightness laser sources. The brightness of bar-based systems is further limited due to emitter cross heating and bar "smile." Cross heating increases the effective thermal resistance, forcing the individual emitters within the diode laser bar to run at lower power densities to maintain reasonable reliabilities. Bar smile introduces fast axis pointing error and optical defocusing, further diminishing the beam quality of the system.

Thus, although several laser diode module designs have emerged over the past few decades, a need remains for a laser diode apparatus that reduces the number of elements used in the optical system or reduces the overall complexity, while maintaining the ability to individually address pointing and collimation of the individual laser beams, so that a module may be provided that is simpler to manufacture and that can exhibit improved etendue preservation, while providing high-power low-divergence output.

SUMMARY OF THE INVENTION

The present invention satisfies the aforementioned need by providing a diode laser apparatus that reflects parallel propagating diode laser beams at a small angle out of the emission plane. Thus, according to one aspect of the present invention, a diode laser apparatus includes a plurality of spaced apart diode lasers, each of the diode lasers situated and configured to emit a diode laser beam substantially parallel to each other diode laser beam in an emission plane in a first direction, and a plurality of reflectors situated with respect to the diode lasers and configured to receive respective diode laser beams and to reflect the respective diode laser beams substantially parallel and out of the emission plane at a small angle therewith in a second direction such that the reflected diode laser beams are in a stacked configuration.

Accordingly, reflected beams avoid substantial impingement as the beams propagate past adjacent reflectors. Thus, diode lasers may be arranged to emit into the same emission plane, reducing the complexity of the diode laser installation, reducing machining requirements, and allowing for identical piece-parts. While in some embodiments the reflectors are substantially planar, in other embodiments the reflectors include non-planar geometries to provide both reflection and slow axis collimation. In some examples the diode lasers are arranged to emit beams into an emission plane that is at an angle with respect to the housing surface such that the stacked configuration of reflected beams may propagate substantially parallel to the housing surface for subsequent coupling into a focusing objective. The foregoing and other objects, features, and advantages will become more apparent from the following detailed description, which proceeds with reference to the accompanying figures.

DETAILED DESCRIPTION OF THE INVENTION

Figure 1:
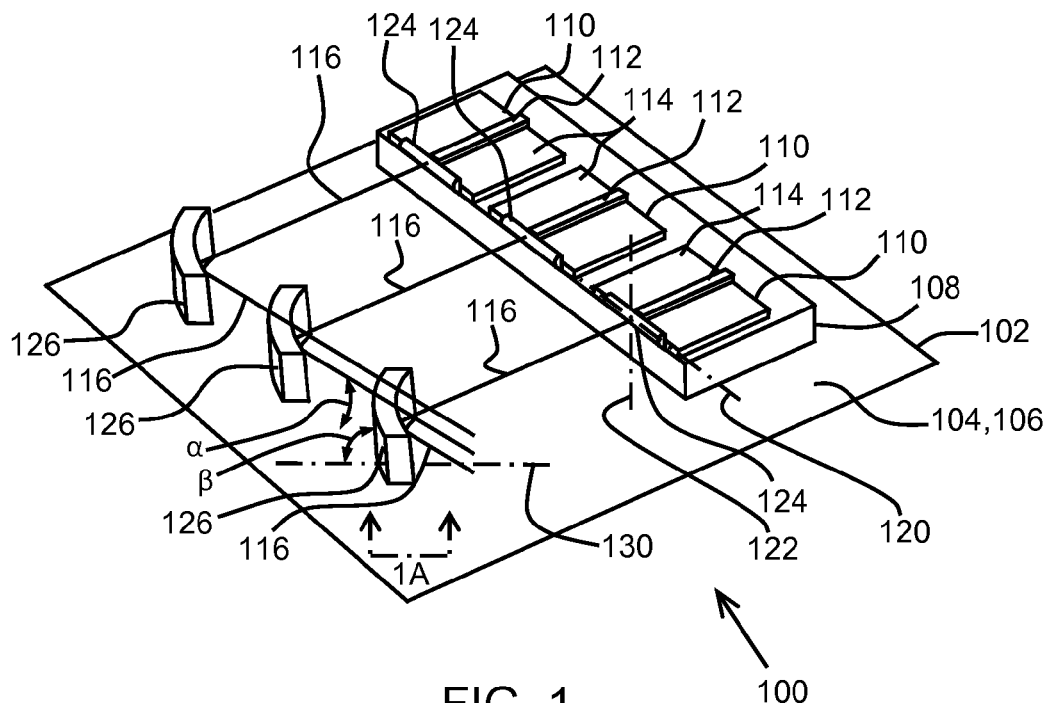
FIG. 1 is a perspective view in accordance with an out of plane embodiment of the diode laser apparatus of the present invention.

In examples herein, both reflective slow axis collimators and planar reflectors may be used to direct and combine beams out of plane. Referring now to FIG. 1, an embodiment of a laser diode apparatus 100 is shown providing such out of plane beam combination. A housing 102, made of a conductive material such as aluminum or copper, includes a housing mounting surface 104 which is configured for receiving a mounting block 108 upon which a plurality of diode laser structures 110 are attached. Housing mounting surface 104 defines a mounting surface plane 106. Each diode laser structure 110 includes at least one single-emitter diode laser 112 mounted on a submount 114. Mounting block 108 is preferably a raised block structure, elevating the corresponding diode laser structures 110 above the housing mounting surface 104 for subsequent out of plane reflection of diode laser beams 116.

For square or rectangular mounting block 108 and diode laser structures 110, the diodes lasers 112 can then become conveniently arranged to emit respective diode laser beams 116 parallel to each other in a first direction and in an emission plane 118 (see FIG. 2) that is offset from and parallel to mounting surface plane 106. The slow axes 120 for each diode laser beam 116 are parallel lying in the emission plane 118. The corresponding fast axes 122 lie orthogonal to the emission plane 118. In some examples, the mounting block 108 could provide the functionality of the submount 114 for some or all of the diode lasers 112. In others embodiments, each submount 114 could be sized and positioned for direct attachment to the mounting surface 104. Other configurations are possible as well, providing the diode lasers 112 at a height suitable for subsequent beam combination of emitted diode laser beams 116. The wavelength of the diode lasers can be selected from a broad range for the particular application, though preferred examples emit at selected wavelengths between 900 and 1000 nm.

Figure 2:
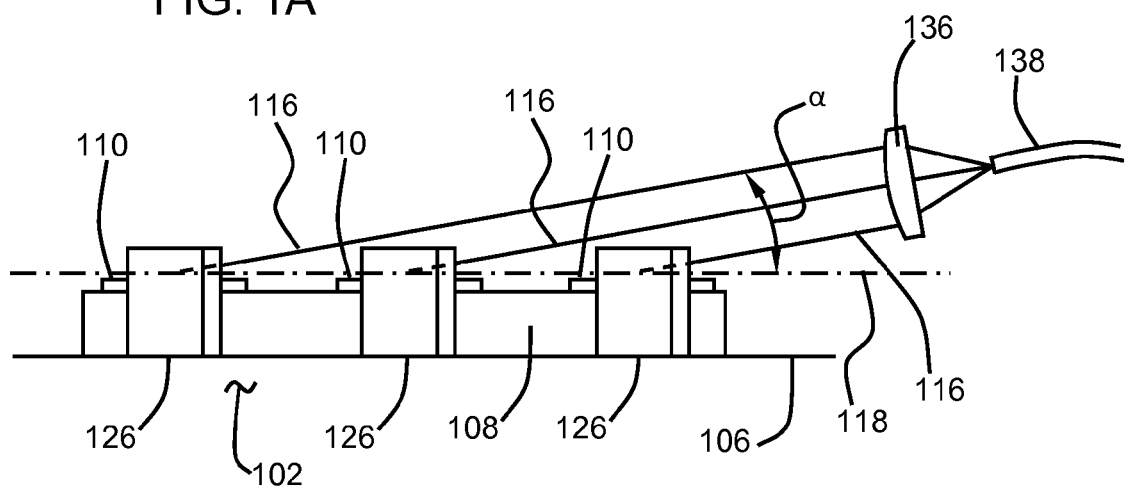
FIG. 2 is a side view of the embodiment of the apparatus shown in FIG. 1.

High-power diode laser beams 116 typically exhibit asymmetric beam divergence. One or more fast axis collimators 124 are disposed in close relation to the diode lasers 112 for collimating or otherwise controlling the divergence of the laser beams 116 along the fast axis 122. The diode laser beam divergence along the slow axis 120 is compensated for with a slow axis collimator 126 situated at a suitable distance from the diode laser 112. In some embodiments, the slow axis collimators 126 are also reflective, as shown in FIGS. 1 and 2, allowing simultaneous collimation along the slow axis 120 of the diode laser beam 116 and reflection into a second direction for stacking of the diode laser beams 116 along the fast axes 122 into a stacked configuration. Different reflective slow axis collimators 126 may be used in accordance with the present invention, and various embodiments thereof as described in U.S. application "Laser Diode Apparatus Utilizing Reflecting Slow Axis Collimators", U.S. Ser. No. 13/328,877 may be used.

Figure 1A:
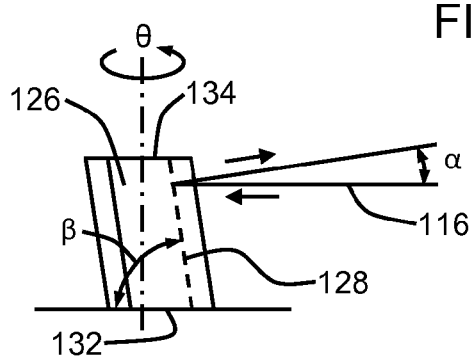
FIG. 1A is a side view of a reflective optical component of the apparatus as seen along line 1A in FIG. 1.

Each reflective slow axis collimator 126 is modified or configured to reflect the diode laser beams 116 out of the emission plane 118 at a small angle α, as can be seen additionally from the side view of apparatus 100 in FIG. 2. Out of plane reflection is created through angled back or front reflective surfaces 128 of the slow axis collimators 126. In side projection view of FIG. 1A, a front reflecting surface 128 is shown providing reflection, shown with directional arrows, at angle α for diode laser beam 116 incident in emission plane 118. Thus, angled reflective surface 128 is provided at other than a perpendicular relation to emission plane 118. For a slow axis collimator 126 having curved reflective surface 128, the angle α may be achieved by further defining the orientation of reflective surface 128 in relation to the center of curvature or cylindrical focus thereof. For example, in FIG. 1 a focus-intersecting reference line 130 is drawn lying in mounting surface plane 106; here plane 106 being parallel to emission plane 118. An angle 13 may then be defined between slow axis collimator 126 and reference line 130. For clarity in FIG. 1, angle 13 is shown in relation to a back reflecting surface of the reflective slow axis collimator 126. In some embodiments, such as those where incident diode laser beams 116 are reflective off only the front surface of the collimator 126, the angle β may be drawn from the front reflecting surface 128, as shown in FIG. 1A. The orientation of the slow axis collimator 126 may also be defined in relation to a rotation angle θ about an axis perpendicular to a bottom surface 132 of the slow axis collimator 126. It should be understood that various orientations of slow axis collimator 126 are possible, along with corresponding defining characteristic angles, the aforementioned description merely being one way to assist in describing an exemplary orientation for providing an out of plane reflection.

The diode beams 116 are preferably reflected at the angle α with respect to the emission plane 118 and also at a right angle as projected into the emission plane 118, though other angles, such as between 85° and 95° or between 70° and 110°, are possible. Since reflecting slow axis collimators 126 are arranged in a row that is parallel to the arrangement of diode lasers 112, reflection off the collimators 126 would result (except for the last of the plurality of slow axis collimators) in each diode laser beam 116 becoming blocked by the adjacent slow axis collimator 126. The angle α provides a sufficient amount of reflection clearance out of the emission plane 118 such that each diode laser beam 116 propagates over the adjacent slow axis collimator 126 so as to avoid substantial impingement thereon. Such out of plane combination can reduce dead-space in the fast axis of the stacked configuration, thereby improving the etendue efficiency of the system. For example, dead space between 25% and 75% of the size of the collimated diode laser beam 116 can be achieved with suitable manufacturing tolerance. The diode laser beams 116 reflect into a stacked configuration of parallel propagating diode laser beams 116, stacked along the fast axes 122 of the beams 116. Suitable values for a include a few degrees, preferably 1-5 degrees, though larger angles are possible, including up to as much as thirty degrees in some embodiments. With respect to the emission plane 118, the beams 116 may be reflected at suitable angles other than right angles, such as in the range of 45° and 135° degrees.

Various geometries and configurations for reflective slow axis collimators 126 are possible. For example, in some embodiments it is convenient for the bottom surfaces 132 thereof to be cut, molded, machined, or otherwise fabricated at the small angle α, as depicted in FIG. 1A, such that when collimators 126 are mounted onto or situated substantially parallel in relation to mounting surface plane 106 the angled orientation, or compound angle, of the collimator reflective surface 128 can provide reflection at the angle α. The top surfaces 134 may also by similarly cut, molded, machined, or otherwise fabricated at the small angle α, also as depicted in FIG. 1A, such that when the collimators 126 are mounted onto or situated substantially parallel in relation to mounting surface plane 106, the top surfaces 134 lie parallel to the emission plane 118, providing additional clearance for a diode laser beam 116 reflected out of the emission plane 118. For reflective slow axis collimators 126 utilizing only a front reflecting surface 128, rear surfaces need not be parallel, and so may have a configuration other than curved or angled.

After forming a stacked configuration, the beams 116 are preferably directed into a focusing objective 136, such as a plano-convex lens, for focusing into an optical fiber 138. Referring to FIG. 2, the objective 136 is positioned directly in the path of the beams 116 after becoming reflected into the stacked configuration. The beams 116 reflected into a stack can also be additionally reflected one or more times before becoming coupled into the objective 136. For example, the stacked beams 116 may be reflected so that the path of the beams is in the same plane as or parallel to the emission plane 118. However, as shown in FIG. 2, one convenient approach is to avoid added parts and complexity by coupling the stacked configuration of beams 116 directly into the objective 136 without further reflection or manipulation. The coupling objective 136 is typically positioned in a transverse relationship with respect to the propagation path of the beams 116, but the objective 136 also may be disposed at an angle to one or more aspects of the apparatus 100, such as the emission plane 118 or mounting surface plane 106.

Various configurations of optical components of apparatus 100 are possible that provide similar functionality while still enabling a high brightness output in a highly efficient module. In some configurations, mounting block 108 can be formed as part of the housing 102 or provided in other geometries (circular, square, etc.). Moreover, additional mounting blocks 108 may be combined in a modular fashion to form larger diode laser apparatuses. Such separate mounting blocks 108 may be installed with adjoining surfaces or they may be adjacent but separated by a predetermined distance. Installation of the mounting block 108 may be performed with soldering, epoxy or other adhesive, as well as with mechanical fasteners, each utilizing an appropriate thermal interface. The separate blocks 108 can also have longer or varying lengths extending parallel to the beam propagation directions. Thus, the block 108 may extend so as to provide a surface for the collimating mirrors 126 to be mounted upon, and the diode laser structures 110 may be mounted in other than an adjacently parallel configuration. That is, one or more diode laser structures 110 or corresponding diode laser 112 may be offset forwards or rearwards with respect to the direction of beam propagation.

Figure 3:
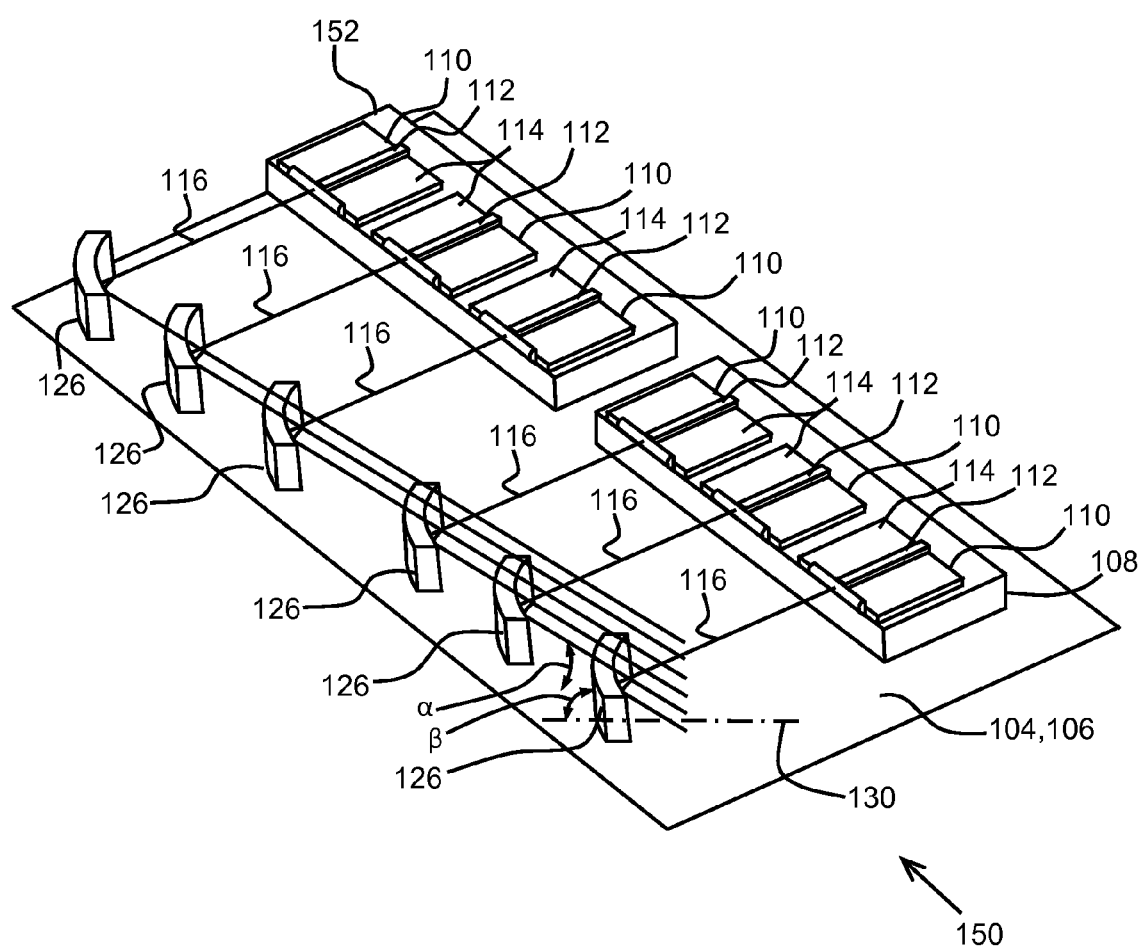
FIG. 3 is a perspective view of a modular embodiment of the diode laser apparatus shown in FIG. 1.

While in preferred examples each diode laser structure 110 includes only one single single-emitter diode laser 112 mounted to submount 114, multi-emitter arrangements are also possible. Also, assemblies of components in the diode laser apparatuses described herein are fully modular, allowing multiple assemblies to be arranged adjacent each other for combining additional diode laser beams. For example, with reference to FIG. 3, a diode laser apparatus 150 is shown which similar in many respects to diode laser apparatus 100 shown in FIGS. 1-2. However, diode laser apparatus 150 includes a second diode laser mounting block 152 adjacently arranged with respect to first mounting block 108 such that additional diode laser beams 116 are stacked with diode laser beams 116 associated with diode lasers 112 emitting from the first mounting block 108. It will be appreciated that other changes may be made consistent with the stacking or combining of the diode laser beams 116 out of the emission plane 118 in a modular fashion. For example, in some embodiments the emission planes of the diode lasers 112 may be parallel instead of coplanar. Moreover, groups of diode laser beams 116 in various embodiments disclosed herein may be modularly combined in various ways understood in the art, such as geometric, polarization, or wavelength beam combining.

In other examples, different diode lasers 112 are capable of emitting diode laser beams 116 at different wavelengths. The number of diode laser structures 110 may also be increased or decreased, along with the corresponding reflective surfaces 128, to increase or decrease the number of diode laser beams 116 stacked along the fast axis 124. The mounting block 108 is generally made from a heat dissipative material, such as copper, CuW, BeO, AlN, or aluminum, or an alloy thereof. Due to the large amount of heat generated by the diode lasers 112, the apparatus 100 and housing 102 are typically cooled with a water cooled plate, an air-cooled plate, a thermoelectric cooler or other cooling mechanism.

Figure 4:
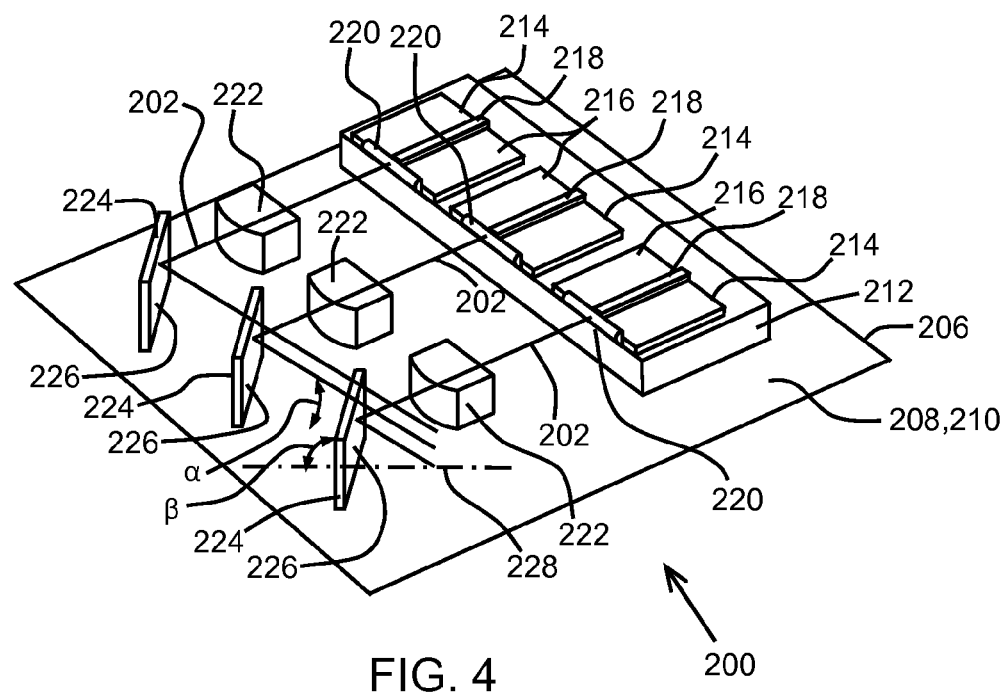
FIG. 4 is a perspective view in accordance with another out of plane embodiment of the diode laser apparatus of the present invention.
Figure 5:
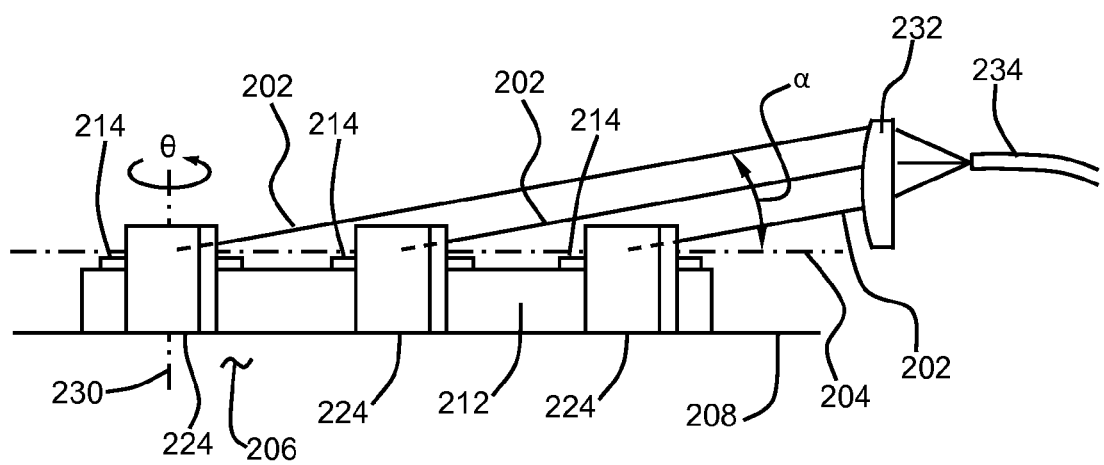
FIG. 5 is a side view of the embodiment of the apparatus shown in FIG. 3.

Referring now to FIGS. 4 and 5, another embodiment of a diode laser apparatus 200 is shown which also provides diode laser beams 202 reflected into a stack propagating directionally out of plane with respect to an emission plane 204, similar in many respects to diode laser apparatus 100. Diode laser apparatus 200 includes a housing 206 which provides a housing mounting surface 208 for mounting optical and structural components. The housing mounting surface 208 also defines a mounting surface plane 210. A rectangular mounting block 212 is attached to the housing surface 208 in the mounting surface plane 210. The mounting block 212 includes a plurality of diode laser structures 214 attached to an upper surface thereof so as to be arranged adjacent to each other. Each diode laser structure 214 typically includes a submount 216 upon which is mounted a diode laser 218 capable of emitting a diode laser beam 202. The diode lasers 218 are arranged to be spaced apart from each other so as to emit the respective diode laser beams 202 parallel to each other in a first direction and into a common emission plane 204. In convenient examples, the emission plane 204 lies parallel to and above the mounting surface plane 210.

The diode laser structures 214 also include fast axis collimators 220 optically coupled to the diode lasers 214 to collimate the rapidly divergent fast axes of the respective diode laser beams 202. Instead of reflective slow axis collimators 126, diode laser apparatus 200 includes non-reflective slow axis collimators 222 positioned in the path of and configured to receive the diode laser beams 202. Slow axis collimators 222 are typically in the form of cylindrical lenses and are optically operable to collimate the incident diode laser beam 202 along the slow axes thereof without substantially altering the direction of the principal ray of the propagating beam 202. The diode laser apparatus 200 also includes a plurality of mirrors 224 having reflective planar surfaces 226 optically coupled to the collimated diode laser beams 202 and configured to reflect the diode laser beams 202 into a second direction, preferably at a right angle in the emission plane 204 and also at a small angle α with respect to the emission plane 204.

To achieve reflection out of plane at small angle α, the reflective planar surface 226 of mirror 224 is oriented at other than a perpendicular relation to emission plane 204. As depicted in FIG. 4, the desired out of plane reflection is achieved by obtaining an angle β between surface 226 and a reference line 228 in emission plane 204 drawn perpendicularly to the lateral length of reflective surface 226. To achieve reflection in the emission plane 204 at selected angles to the paths of incident beams 202, mirrors 224 are mounted to the housing mounting surface 208 and rotated to a selected angle. For example, a right angle reflection in the emission plane 204 may be obtained in part by rotating a corresponding mirror 224 to an angle θ about a reference axis 230 perpendicular to the emission plane 204 and with respect to the path of the incident beam 202, similar to angle θ in diode laser apparatus 100. It should be understood that various orientations of mirror 224 are possible, along with corresponding defining characteristic angles, the aforementioned description merely being one way to assist in describing an exemplary orientation for providing a reflection out of the emission plane 204.

Since reflecting planar surfaces 226 of mirrors 224 are arranged in a row that is parallel to the arrangement of diode lasers 218, reflection off the mirrors 224 would result (except for the last of the plurality of mirrors) in each diode laser beam 202 becoming blocked by the adjacent mirror 224. The angle α provides a sufficient amount of reflection clearance out of the emission plane 204 such that each diode laser beam 202 propagates above the adjacent mirror 224 so as to avoid substantial impingement thereon. The diode laser beams 202 reflect into a stacked configuration of parallel propagating diode laser beams 202, stacked along the fast axes of the beams 202. Suitable values for α include a few degrees, such as 1°-5°, or as much as 30° in some embodiments. With respect to the emission plane 204, the beams 202 may be reflected at suitable angles other than right angles, such as in the range of 45° and 135° degrees. For configurations in which the beams 202 are reflected by the mirrors 224 at other than right angles, to maintain a stacked arrangement of beams 202, the mirrors 224 may be arranged in a configuration other than parallel to the plurality of emitting diode lasers 218.

After forming a stacked configuration, the beams 202 are preferably directed into a focusing objective 232, such as a plano-convex lens, for focusing into an optical fiber 234. Referring to FIG. 5, the objective 232 is positioned directly in the path of the beams 202 after becoming reflected into the stacked configuration. The beams 202 reflected into a stack can also be additionally reflected one or more times before becoming coupled into the objective 232. For example, the stacked configuration of beams 202 may be reflected so that the path of the beams is in the same plane as or parallel to the emission plane 118. However, as shown in FIG. 5, one convenient approach is to avoid added parts and complexity by coupling the stack of beams 202 directly into the objective 232 without further reflection or manipulation.

The coupling objective 232 is typically positioned in a transverse relationship with respect to the propagation path of the beams 202, but the objective 232 also may be disposed at an angle as well. In some examples, the objective 232 is conveniently aligned with a registrable feature of the apparatus 200, such as a side-wall of the housing 206. Since the stacked configuration of beams 202 is propagating at a small angle, the objective 232 can then be configured to receive such off-axis illumination. For example, a plano-convex objective 232 can be offset and other parameters tuned, such as curvature, thickness, etc., to provide the propagation path and aberration correction for the stacked configuration. For low NA light (e.g., from 0.1 NA to 0.15 NA) and relatively small angles, a conventional lens may be used without requiring correction for comatic aberration. Various lens design techniques may be used to correct for coma, including the addition of a meniscus lens to form a Gauss objective, modifying the convex surface of the objective 232 to an aspheric surface, or adding a wedge optic to alter the direction of the propagating beams 202 prior to propagation through the objective 232.

Figure 6:
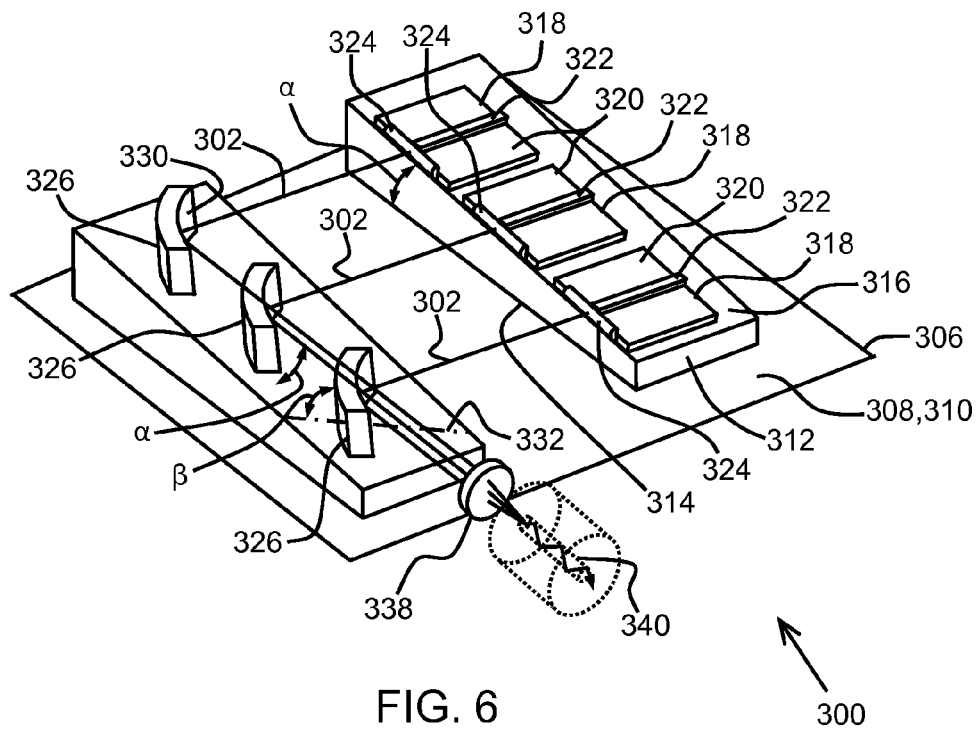
FIG. 6 is a perspective view in accordance with another out of plane embodiment of the diode laser apparatus of the present invention.
Figure 7:
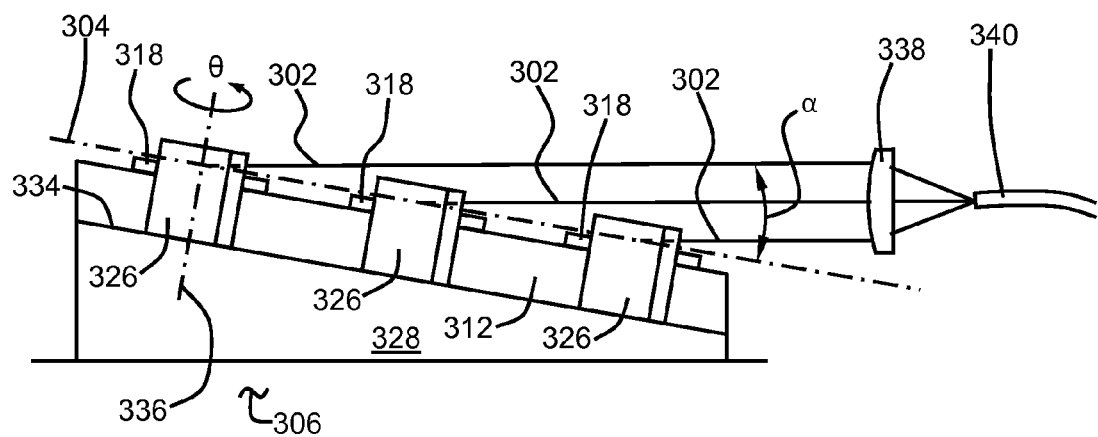
FIG. 7 is a side view of the embodiment of the apparatus shown in FIG. 5.

With reference now to FIGS. 6 and 7, another embodiment of a diode laser apparatus 300 is shown which is also operable to provide diode laser beams 302 into a stacked configuration of beams 302 out of plane with respect to an emission plane 304. The diode laser apparatus 300 includes a housing 306 which provides a housing mounting surface 308 for mounting optical and structural components. The housing mounting surface 308 also defines a mounting surface plane 310, which is not parallel to emission plane 304.

A wedge shaped mounting block 312 has a bottom surface 314 mounted to the housing mounting surface 308. The wedge mounting block 312 includes a top surface 316 inclined at a small angle α with respect to bottom surface 314. A plurality of adjacently arranged diode laser structures 318 are mounted on the block 312. Each diode laser structure 318 typically includes a rectangular submount 320 upon which is mounted a diode laser 322 capable of emitting a diode laser beam 302 therefrom having slow and fast axes respectively parallel and perpendicular to the emission plane 304. The diode lasers 322 are arranged to be spaced apart from each other so as to emit the respective diode laser beams 302 parallel to each other in a first direction and into the common emission plane 304. Thus, the mounting block 312 is configured to provide the emission of the laser beams 302 in an emission plane 304 that is at an angle with respect to the mounting surface plane 310 while respective slow axes of each beam 302 are in the emission plane 304 and corresponding fast axes are orthogonal to the emission plane 304.

The diode laser apparatus 300 also includes fast axis collimators 324 optically coupled to the diode lasers 322 to collimate the rapidly divergent fast axes of the respective diode laser beams 302. In typical embodiments, the fast axis collimators 324 are attached to the diode laser structure or are not attached but in close proximity to the emitting facets of the diode lasers 322. The divergence along the slow axes of the propagating laser beams 302 is compensated for with a slow axis collimator 326 disposed at a suitable distance from the diode laser 322. As shown in FIGS. 6 and 7, slow axis collimators 326 are reflective slow axis collimators, providing both collimation along the slow axes of the propagating beams as well as reflection of the beams 302 in a second direction into an organized stacked configuration of beams stacked along the fast axes of the propagating beams.

However, it should be understood that diode laser apparatus 300 could also utilize pairs of non-reflective slow axis collimators and planar reflective mirrors, examples of which are shown for diode laser apparatus 200 in FIGS. 4 and 5. Moreover, while the beams 302 are preferably stacked such that the fast axis of each propagating diode laser beam 302 is in a collinear relationship in the stacked configuration, other configurations are possible including less than collinear alignment and parallel, non-collinear alignment of the respective fast axes. The reflective slow axis collimators 326 (or alternatively planar reflectors) are configured to reflect the diode laser beams 302 preferably at a right angle in the emission plane 304 and also at a small angle α with respect to the emission plane 304. Different reflective slow axis collimators 326 may be used in accordance with the present invention, and various embodiments thereof as described in U.S. application "Laser Diode Apparatus Utilizing Reflecting Slow Axis Collimators", U.S. Ser. No. 13/328,877 may be used.

To bring the reflective slow axis collimators 326 into a suitable spatial relationship with the emission plane 304, collimators 326 are shown as having the bottom surfaces thereof attached to a spatially separated second wedge block 328. Due to the angular configuration of the emission plane 304, the reflected stack of beams 302 can be directed parallel to the mounting surface plane 310 or some other registrable feature of the housing 306. Also, because the reflectors are configured to provide the reflected diode laser beams 302 out of the emission plane 304, substantial impingement or clipping is avoided of the reflected diode laser beams 302 on adjacent reflectors 326.

To achieve reflection out of the emission plane 304 at small angle α, the reflective surface 330 of reflector element 326 is oriented at other than a perpendicular relation to emission plane 304. As depicted in FIG. 6, the desired reflection out of emission plane 304 is achieved by obtaining an angle 13 between surface 330 and a reference line 332 in the top mounting surface 334 of the separate wedge mounting block 328. To achieve reflection in the emission plane 304 at selected angles to the paths of incident beams 302, reflectors 326 are rotated to a selected angle. For example, a right angle reflection in the emission plane 304 may be obtained in part by rotating a corresponding mirror 326 to an angle θ about a reference axis 336 perpendicular to the emission plane 304 (or top mounting surface 334 of second wedge 328) and with respect to the path of the incident beam 302, similar to angle θ in diode laser apparatuses 100, 200. It should be understood that various orientations of reflector 326 are possible, along with corresponding defining characteristic angles, the aforementioned description merely being one way to assist in describing an exemplary orientation for providing a reflection out of the emission plane 304. Moreover, in some embodiments the second wedge 328 may be omitted, with the reflectors 326 being directly coupled to the housing 306, such as to the housing mounting surface 308. To enhance alignment and clipping-prevention, one or more of the top and bottom surfaces of the reflectors 326 may be machined to predetermined angles.

As shown in FIG. 7, the stack of beams can be coupled into a focusing objective 338 which here is conveniently in a perpendicular relationship to the housing mounting surface 308 through alignment with a side-wall of housing 306. In some embodiments, the reflecting elements 326 can be attached directly to the housing mounting surface 308, or other planar surface, without requiring attachment to a separate wedge block 328. The focusing objective 338, as in embodiments described hereinbefore, focuses the beams 302 into an optical fiber 340 for transporting the laser energy to other components or systems.

Figure 8:
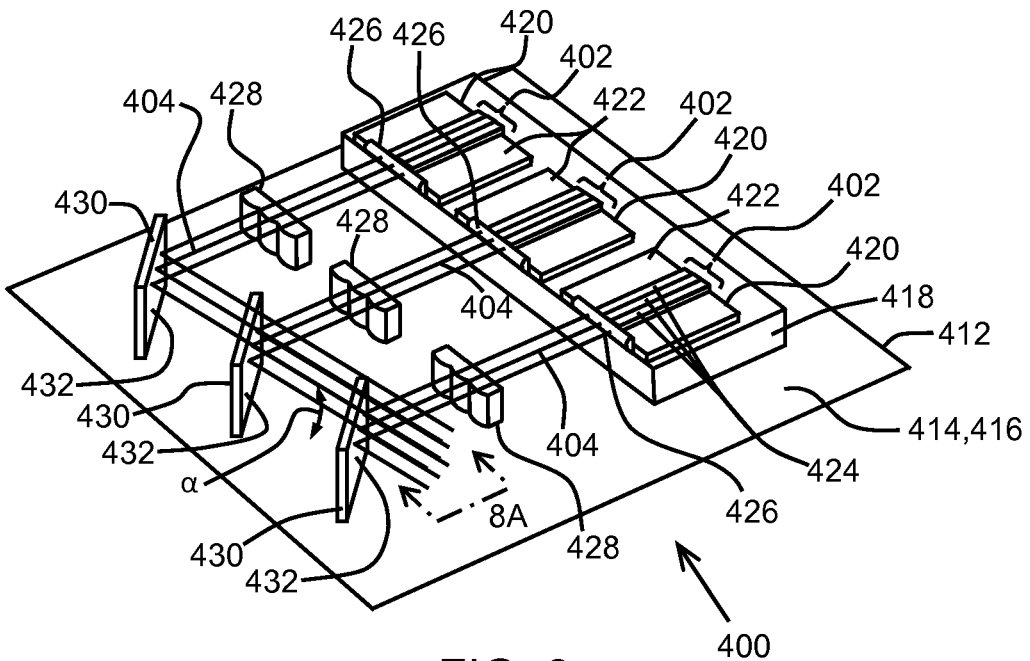
FIG. 8 is a perspective view in accordance with another out of plane embodiment of the diode laser apparatus of the present invention.

As mentioned hereinbefore, some embodiments utilize different emitter configurations. In FIG. 8 an additional example of a diode laser apparatus 400 is shown that utilizes laser bar type emitter groups 402. Each emitter is operable to emit a diode laser beam 404 into a first direction into an emission plane 406 which then become reflected into a stacked configuration, shown in the cross-section of the propagating beams in FIG. 8A, propagating directionally out of the emission plane 406. Accordingly, diode laser apparatus 400 shares similarities with aforementioned described embodiments. The bars 402 emit beams 404 such that the fast axes 408 of a particular bar 402 are parallel to and spaced apart from each other and the slow axes 410 thereof are collinear.

Diode laser apparatus 400 also includes a housing 412 which provides a housing mounting surface 414 for mounting optical and structural components. The housing mounting surface 414 also defines a mounting surface plane 416. A rectangular mounting block 418 is attached to the housing surface 414 in the mounting surface plane 416. The mounting block 418 includes a plurality of diode laser structures 420 attached to an upper surface thereof so as to be arranged adjacent to each other. Each diode laser structure 420 typically includes a submount 422 upon which is mounted a laser bar 402 of diode lasers 424 capable of emitting a plurality of diode laser beams 404, shown as three separate beams 404 per bar 402 in FIGS. 8 and 8A.

Figure 8A:
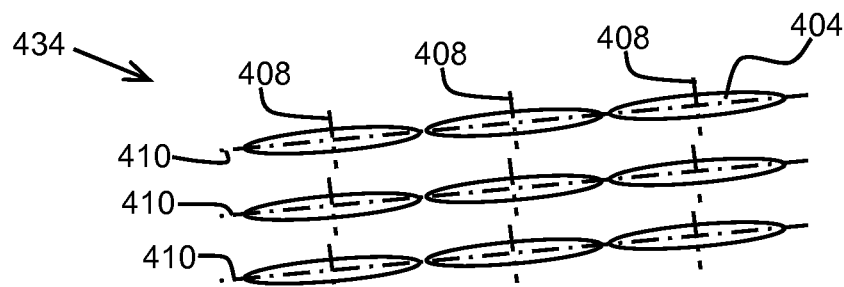
FIG. 8A is cross-sectional view of reflected beams as seen along line 8A in FIG. 8.
Figure 9:
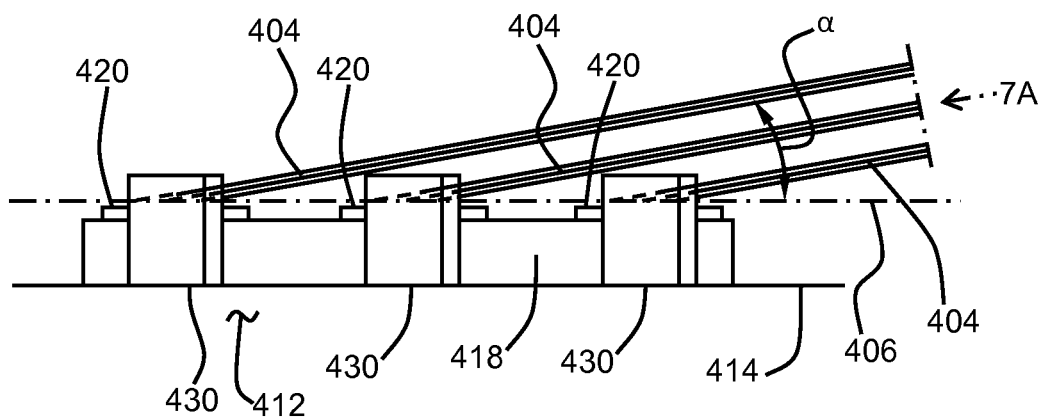
FIG. 9 is a side view of the embodiment of the apparatus shown in FIG. 8.

The diode laser structures 420 also include fast axis collimators 426 optically coupled to the diode laser bars 402 to collimate the rapidly divergent fast axes 408 of the respective diode laser beams 404. Diode laser apparatus 400 preferably collimates the beams 404 with a lens array of cylindrical slow axis collimators 428 positioned in the path of and configured to receive the diode laser beams 404. The diode laser apparatus 400 also includes a plurality of mirrors 430 having reflective planar surfaces 432 optically coupled to the collimated diode laser beams 404 and configured to reflect the diode laser beams 404 into a second direction, preferably at a right angle in the emission plane 406 and also at a small angle α with respect to the emission plane 406. Reflection out of the emission plane 406 may be achieved similarly as for diode laser apparatus 200. The reflected diode laser beams 404 may then be coupled into a focusing objective as in other embodiments. However, as shown in FIG. 8A the bar emitter groups 402 emitting groups of beams 404 once reflected into the stacked configuration, form a rectangular array 434 of beams 404.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A diode laser apparatus comprising:
    a plurality of diode lasers situated to emit a beam along a respective initial propagation axis, each beam having an associated fast axis and slow axis, wherein the fast, slow, and initial propagation axes are mutually orthogonal, and the initial propagation axes are parallel and the associated beam slow axes are in a common plane;

collimation optics situated to receive the beams propagating along respective initial propagation axes and produce corresponding collimated beams; and a plurality of fixed reflectors situated to receive the collimated beams and to reflect the collimated beams so as to propagate along respective reflected beam propagation axes that are perpendicular to the corresponding initial propagation axes and with an angle between each reflected beam propagation axis and the common plane that is sufficiently small to provide the reflected beams in a close-packed, stacked configuration, such that the reflected beam propagation axes are offset from each other so as to avoid beam clipping by the plurality of fixed reflectors, and the reflected collimated beams have associated mutually parallel slow axes.

2. The diode laser apparatus of claim 1 wherein the angle is between about 1 and 5 degrees.

3. The diode laser apparatus of claim 1 wherein the reflected beam fast axes are substantially coplanar.

4. The diode laser apparatus of claim 1 wherein the collimation optics include fast axis collimation optics configured to receive the beams propagating along the initial propagation axes and to collimate the diode laser beams along fast axes thereof.

5. The diode laser apparatus of claim 1 wherein said reflectors are planar mirrors.

6. The diode laser apparatus of claim 1 wherein the collimation optics include slow axis collimation optics configured to receive the beams propagating in said common plane along the initial propagation axes and to collimate the beams along a slow axis thereof.

7. The diode laser apparatus of claim 1 further comprising focusing optics situated to receive the close-packed stacked configuration of reflected beams.

8. The diode laser apparatus of claim 7 wherein said focusing optics include an objective lens.

9. The diode laser apparatus of claim 1 further comprising a housing and a mounting block attached to a housing surface of said housing, said mounting block providing a mounting block surface upon which said diode lasers are mounted.

10. The diode laser apparatus of claim 9 wherein said mounting block surface is provided at said angle with respect to said housing surface such that the reflected beam propagation axes are substantially parallel to said housing surface.

11. The diode laser apparatus of claim 1 wherein said diode lasers include diode laser bars.

12. A diode laser apparatus comprising:
a plurality of spaced apart diode lasers configured to emit respective beams having initial beam propagation axes substantially parallel to each other in an emission plane, each beam having a slow axis lying in said emission plane; and a plurality of fixed reflectors configured to receive respective beams with initial beam propagation axes in said emission plane and to reflect the beams such that reflected beam propagation axes are substantially parallel to each other perpendicular to the initial beam propagation axes and at a small angle with respect to said emission plane such that the reflected beams are in a close-packed stacked configuration with each beam slow axis parallel to each other beam slow axis and without each reflected beam clipping an adjacent reflector.

13. The diode laser apparatus of claim 12 wherein said small angle is between about 1 degrees and about 5 degrees.

14. A diode laser apparatus comprising:
a plurality of diode lasers configured to emit respective beams having initial propagation axes substantially parallel to each other in an emission plane in a first direction, each beam having a slow axis thereof lying in said emission plane;

a plurality of fast axis collimators optically coupled to respective beams with corresponding initial propagation axes in said emission plane for collimating the fast axis of each respective beam;

a plurality of slow axis collimators optically coupled to respective fast-axis collimated beams and configured to collimate the slow axes thereof; and a plurality of immovably situated reflectors configured to receive respective collimated beams having corresponding initial propagation axes lying in said emission plane and to reflect the collimated beams such that the reflected propagation axes thereof are substantially parallel to each other in a second direction perpendicular to the first direction and at a small angle with said emission plane such that the reflected diode laser beams are in a close-packed, stacked configuration, the reflected beam propagation axes being offset from each other so as to avoid clipping by the plurality of immovably situated.

* * * * *